United States Patent [19]

Swanson et al.

[11] Patent Number: 5,030,295
[45] Date of Patent: Jul. 9, 1991

[54] RADIATION RESISTANT PASSIVATION OF SILICON SOLAR CELLS

[75] Inventors: Richard M. Swanson, Los Altos; Jon-Yiew Gan, Stanford; Peter E. Gruenbaum, Menlo Park, all of Calif.

[73] Assignee: Electric Power Research Institut, Palo Alto, Calif.

[21] Appl. No.: 478,617

[22] Filed: Feb. 12, 1990

[51] Int. Cl.$^5$ .............................................. H01L 31/06
[52] U.S. Cl. ..................... 136/256; 136/261; 437/2; 437/980; 357/30; 357/54
[58] Field of Search ............. 136/256, 261; 437/2, 437/4, 980; 357/30 J, 52, 54, 59 R

[56] References Cited

U.S. PATENT DOCUMENTS

| | | | |
|---|---|---|---|
| 4,198,246 | 4/1980 | Wu | 357/59 R |
| 4,234,352 | 11/1980 | Swanson | 136/253 |
| 4,375,125 | 3/1983 | Byatt | 437/239 |
| 4,642,414 | 2/1987 | Rasch et al. | 136/256 |
| 4,778,776 | 10/1988 | Tong et al. | 437/228 |

OTHER PUBLICATIONS

Y. Kwark et al., *Conference Record*, 18*th IEEE Photovoltaic Specialists Conf.*, (1985), pp. 787-791.
F. A. Lindholm, *ibid*, pp. 1003-1007.

*Primary Examiner*—Aaron Weisstuch
*Attorney, Agent, or Firm*—Henry K. Woodward

[57] ABSTRACT

The interface of a silicon oxide passivation layer and a silicon substrate in a silicon solar cell is stabilized by covering the silicon oxide passivation layer with a layer of undoped or phosphorus doped polycrystalline silicon. A second layer of silicon oxide is formed by deposition on the surface of the phosphorus doped polycrystalline and enhances the anti-reflection characteristics of the composite structure.

8 Claims, 1 Drawing Sheet

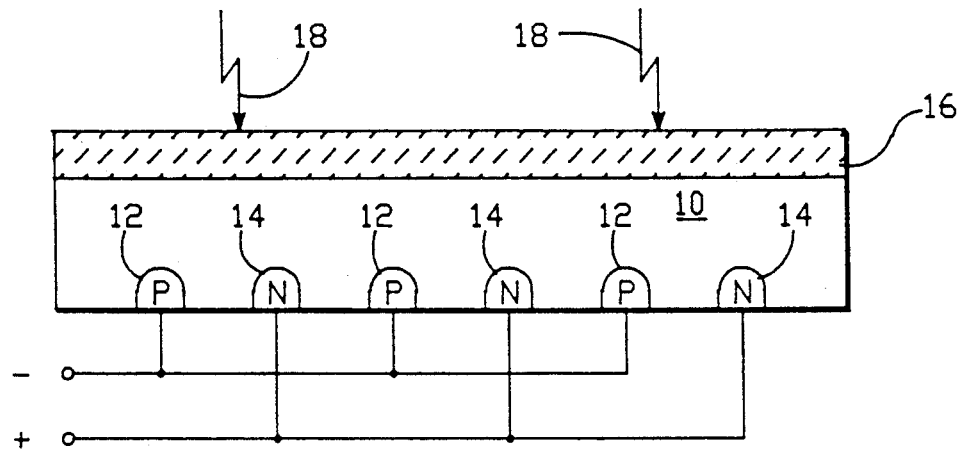
(PRIOR ART)
FIG.—1
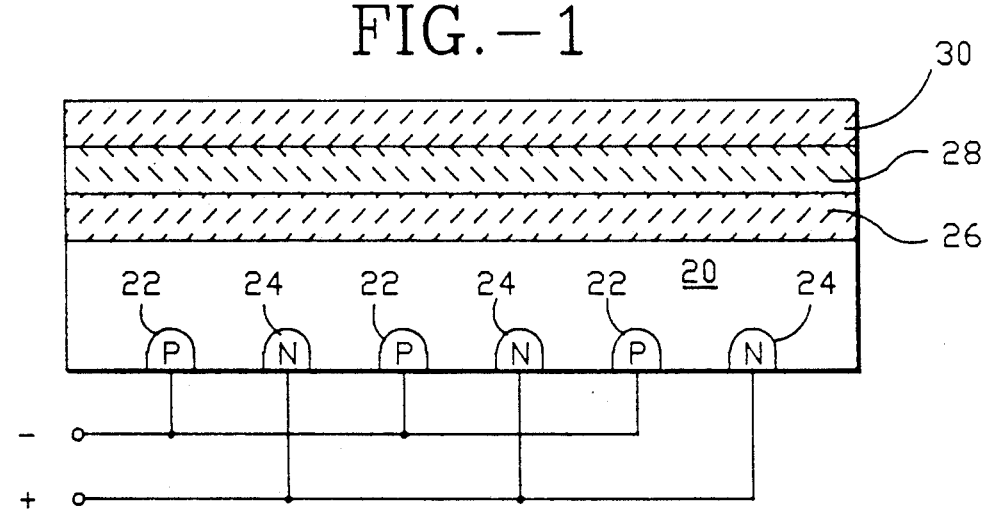
FIG.—2
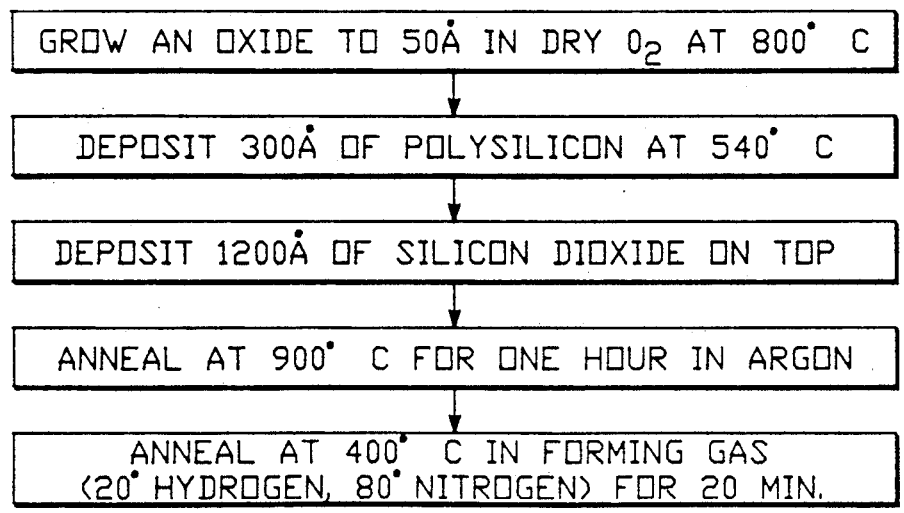
FIG.—3

RADIATION RESISTANT PASSIVATION OF SILICON SOLAR CELLS

BACKGROUND OF THE INVENTION

This invention relates generally to surface passivation of silicon devices, and more particularly the invention relates to passivation of silicon solar cells.

The silicon solar cell generates electrical charge when exposed to solar radiation. The radiation interacts with atoms of the silicon and forms electrons and holes which migrate to P and N doped regions in the silicon body and create voltage differentials between doped regions.

Typically, the silicon body is coated with a silicon oxide passivation layer. This layer may also serve as an anti-reflection layer to impinging radiation, or, alternatively, an additional anti-reflection coating can be applied over the passivation layer. Heretofore, a problem with oxide passivation layers has been a degradation of the surface recombination velocity at the silicon-silicon oxide interface when exposed to concentrated sunlight. This effect is primarily due to hot electrons being created by the ultraviolet end of the solar spectrum and being injected from the silicon into the oxide. One measure of the passivation stability is the emitter saturation current density, $J_o$, which should be as low as possible.

Heretofore, attempts have been at improving the resistance to radiation damage in a silicon solar cell. Weinberg, et al., 4,608,452 and Wysocki, 3,940,965 teach the counter-doping of the silicon body with lithium. However, this technique is structured to minimizing ionizing particle radiation damage of the silicon itself rather than ultraviolet radiation damage to the silicon/silicon oxide interface.

The present invention is directed to a method of improving the stability of a passivation layer on the surface of a silicon solar cell.

SUMMARY OF THE INVENTION

An object of the invention is an improved silicon solar cell.

Another object of the invention is improved stability at the interface of the passivation layer and the silicon body of the solar cell.

Still another object of the invention is reduced emitter saturation current density in a silicon solar cell.

A feature of the invention is a polycrystalline silicon layer in the surface passivation layer of a silicon solar cell.

Briefly, in accordance with the invention a doped polycrystalline silicon layer is included in the passivation layer on the surface of a silicon solar cell. In a preferred embodiment of the invention, the radiation receiving surface of a silicon solar cell has a thin (e.g., 50 Angstrom) thermally grown silicon oxide layer and a thicker (e.g., 300 Angstrom) phosphorus doped polycrystalline silicon layer thereon. A thicker layer of silicon oxide can then be deposited on the polycrystalline layer. The composite structure provides good anti-reflection properties, the silicon oxide/silicon interface has low emitter saturation current density, and the doped polycrystalline silicon layer reduces degradation of surface recombination velocity when the cell is exposed to concentrated sunlight.

The invention and objects and features thereof will be more readily apparent from the detailed description and appended claims when taken with the drawing.

BRIEF DESCRIPTION OF THE DRAWINGS

FIG. 1 is a section view of a back contact silicon solar cell in accordance with the prior art.

FIG. 2 is a section view of one embodiment of a silicon solar cell in accordance with the present invention.

FIG. 3 is a flow diagram of the process in fabricating the silicon solar cell of FIG. 2.

DETAILED DESCRIPTION OF THE PREFERRED EMBODIMENTS

Referring now to the drawings, FIG. 1 is a section view of a conventional back contact silicon solar cell. The cell comprises a lightly doped or intrinsic silicon body 10 in which a plurality of p-doped regions 12 and n-doped regions 14 are all formed in a major surface thereof. The surface is normally provided with a passivating and reflecting layer to prevent radiation from passing through the silicon body and the escape of photons. The opposite surface of the silicon body 10 has a thin layer of silicon oxide 16 grown thereon as a passivating layer and an anti-reflective layer for impinging radiation 18. The silicon oxide layer has a thickness on the order of 1100 Angstroms for anti-reflection purposes. In order to improve the anti-reflection and light trapping properties of the cell, the front side is often texturized. However, texturing of the surface adds stress to the interface and results in a surface that is very sensitive to ultraviolet light degradation.

As noted above, oxide passivation is degraded by ultraviolet radiation in the solar spectrum. It is believed that water-related traps in the oxide increase the degradation.

FIG. 2 is a section view of a silicon solar cell in accordance with one embodiment of the present invention. In this embodiment a lightly doped or intrinsic silicon body 20 is provided with p-doped regions 22 and n-doped regions 24 and one major surface, similar to the silicon solar cell of FIG. 1. However, the passivation layer on the opposite surface is a composite body including a thin silicon oxide layer 26, a phosphorus doped polycrystalline layer 28, and a thicker vapor deposited silicon oxide layer 30. The thin silicon oxide layer 26 (e.g., on the order of 50 Angstroms) improves the problem of water related traps and produces less stress than thick silicon oxide layers. The phosphorus doped poly crystalline silicon layer 28 has a thickness on the order of 300 Angstroms and provided for improving the stability of the passivation layer. It is believed that the function of the doped polycrystalline silicon is to prevent electrons from being injected into the silicon oxide layer from the silicon substrate. Alternatively, interface states may be discouraged from being created even if electronic injection is occurring. While polycrystalline silicon is more absorbtive of incoming light than is silicon oxide, a polysilicon crystalline layer of 300 Angstroms will absorb only about 3% of the impinging light, which is a fair trade-off for the increased stability offered thereby. Undoped polycrystalline silicon can be used, also.

FIG. 3 is a process flow chart illustrating the steps of fabricating the silicon solar cell of FIG. 2. Initially, a silicon oxide layer of approximately 50 Angstroms is thermally grown on the surface of the silicon substrate at a temperature of 800° C. Thereafter, 300 Angstroms of polycrystalline silicon is deposited at 540° C. with a phosphorus dopant concentration of $3 \times 10^{20}$ atoms per cubic centimeter when deposited. Thereafter, a silicon oxide layer of approximately 1200 Angstroms is deposited on the surface of the doped polycrystalline silicon. The entire structure is then annealed at 900° C. for one hour in argon followed by an anneal at 400° C. in forming gas (i.e., 20% hydrogen, 80% nitrogen) for 20 minutes. The dopant concentration in the polycrystalline silicon after the annealing is approximately $3 \times 10^{19}$ atoms per cubic centimeter.

The use of doped polycrystalline silicon in the passivation layer for a silicon solar cell has proved to add stability to the silicon oxide/silicon interface. To the extent that the doped polycrystalline silicon passivation is preventing the creation of interface states in the presence of injected electrons, then the polycrystalline silicon passivation has uses outside of solar cells, such as in polysilicon gate MOS devices, since hot electron damage in the form of avalanche injection and Fowler-Nordheim tunneling is a problem in such devices. Further, use of a polysilicon gate in a MOS transistor should be resistant to hot electron damage.

While the invention has been described with reference to the specific embodiment, the description is illustrative of the invention and is not construed as limiting the invention. Various modifications and applications made according to those skilled in the art without departing from the true spirit and scope of the invention as defined by the appended claims.

We claim:

1. A silicon solar cell having improved stability when exposed to concentrated solar radiation, comprising:
    a body of silicon material having a major surface for receiving radiation,
    a plurality of p and n conductivity regions in said body for collecting electrons and holes created by impinging radiation, and
    a passivation layer on said major surface including a first layer of silicon oxide in contact with said body and a polycrystalline silicon layer on said first layer of silicon oxide.

2. The silicon solar cell as defined by claim 1 wherein the thickness of said polycrystalline silicon layer is greater than the thickness of said first layer of silicon oxide.

3. The silicon solar cell as defined by claim 2 and further including a second layer of silicon oxide on the surface of said polycrystalline silicon layer.

4. The silicon solar cell as defined by claim 3 wherein the thickness of said first silicon oxide layer is on the order of 50 Angstroms, the thickness of said polycrystalline silicon layer is on the order of 300 Angstroms, and the thickness of said second silicon oxide layer is on the order of 1200 Angstroms.

5. The silicon solar cell as defined in claim 3 wherein said first silicon oxide layer is thermally grown, said polycrystalline silicon layer is vapor deposited, and said second layer of silicon oxide is vapor deposited.

6. The silicon solar cell as defined in claim 5 wherein said polycrystalline silicon layer is doped with phosphorus.

7. The silicon solar cell as defined in claim 6 wherein the dopant concentration of phosphorus is on the order of $3 \times 10^{19}$ atoms per cubic centimeter.

8. A method of stabilizing a silicon oxide/silicon interface in a silicon solar cell comprising the steps of forming a doped polycrystalline silicon layer on said layer of silicon oxide, and forming a layer of silicon oxide material on the surface of said doped polycrystalline silicon layer.

* * * * *

UNITED STATES PATENT AND TRADEMARK OFFICE
CERTIFICATE OF CORRECTION

PATENT NO. : 5,030,295
DATED : July 9, 1991
INVENTOR(S) : RICHARD M. SWANSON, JON-YIEW GAN, and PETER E. GRUENBAUM It is certified that error appears in the above-identified patent and that said Letters Patent is hereby corrected as shown below:

Cover page, after "Assignee:," change to:

--Electric Power Research Institute
  Palo Alto, California ( part interest)

Board of Trustees of the Leland Stanford Junior
  University, Stanford, California ( part interest)--.

Signed and Sealed this

Ninth Day of February, 1993

Attest:

STEPHEN G. KUNIN

*Attesting Officer*  *Acting Commissioner of Patents and Trademarks*